US009462683B2

(12) United States Patent
Bach (10) Patent No.: US 9,462,683 B2
(45) Date of Patent: Oct. 4, 2016

(54) APPLIANCE USING COLORED MATERIAL FOR APPEARANCE OF DESIRED COLOR LIGHT ON USER INTERFACE (71) Applicant: General Electric Company, Schenectady, NY (US)

(72) Inventor: James Carter Bach, Seymour, IN (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 186 days.

(21) Appl. No.: 14/524,310

(22) Filed: Oct. 27, 2014

(65) Prior Publication Data
US 2016/0120028 A1    Apr. 28, 2016

(51) Int. Cl.
*F21V 9/10* (2006.01)
*H05K 1/02* (2006.01)
*F24C 7/08* (2006.01)
*G06F 3/044* (2006.01)
*H05K 1/14* (2006.01)
*G06F 1/16* (2006.01)

(52) U.S. Cl.
CPC ............ *H05K 1/0274* (2013.01); *F24C 7/082* (2013.01); *F24C 7/086* (2013.01); *G06F 1/16* (2013.01); *G06F 3/044* (2013.01); *H05K 1/144* (2013.01)

(58) Field of Classification Search
CPC ........ F21V 33/0044; F24C 7/00; F24C 7/02; F24C 7/086; F24C 7/082; F24C 15/106; G06F 3/044
See application file for complete search history.

(56) References Cited

U.S. PATENT DOCUMENTS

| 4,929,053 | A | * | 5/1990 | Muller-Stute | C08K 3/22 385/141 |
| 5,881,196 | A | * | 3/1999 | Phillips | G02B 6/03638 385/127 |
| 6,784,603 | B2 | * | 8/2004 | Pelka | B82Y 10/00 313/110 |
| 9,140,458 | B2 | * | 9/2015 | Hoffmann | F24C 7/082 |
| 2010/0142211 | A1 | | 6/2010 | Boelstler et al. | |
| 2013/0083519 | A1 | | 4/2013 | Frank | |
| 2013/0328946 | A1 | | 12/2013 | Zenker | |
| 2014/0146530 | A1 | | 5/2014 | Guiset et al. | |

FOREIGN PATENT DOCUMENTS

CN       201408781 Y    2/2010
DE       102009003138   11/2010

OTHER PUBLICATIONS

Co-pending U.S. Appl. No. 14/524,320, filed Oct. 27, 2014.
Co-pending U.S. Appl. No. 14/524,339, filed Oct. 27, 2014.

* cited by examiner

*Primary Examiner* — Anabel Ton
(74) *Attorney, Agent, or Firm* — Dority & Manning, PA (57) ABSTRACT

The present invention provides a cooktop appliance with features for correcting the color of light passing through the cooking surface such that the light appears a desired to a user of the cooktop appliance. More specifically, a colored translucent ink may be applied to a light transmissive layer of a user interface assembly such that light passing through the ink and the cooking surface appears a desired color to the user.

19 Claims, 10 Drawing Sheets

APPLIANCE USING COLORED MATERIAL FOR APPEARANCE OF DESIRED COLOR LIGHT ON USER INTERFACE

FIELD OF THE INVENTION

The subject matter of the present disclosure relates generally to user interface assemblies for appliances, in particular cooktop appliances.

BACKGROUND OF THE INVENTION

Cooktop appliances typically can include a variety of configurations. As an example, cooktop appliances may use a glass and/or ceramic-glass cooking panel for supporting cooking utensils. For such cooktop appliances, the heating sources can include, e.g., radiant, induction, and gas on glass. A variety of controls can be provided for the heating sources such as, e.g., traditional rotatable knobs and/or electronic types that rely on sensitivity to a user's touch. These controls may be provided as part of a user interface assembly for controlling various operations of the cooktop appliance.

Such user interface assemblies may use a variety of lighted text, digits, and/or symbols to display information to a user of the cooktop appliance on the surface of the cooktop appliance. For example, the upper surface of the cooking panel may include a user interface area where the controls are located, as well as where information such as, e.g., whether a heating element is activated or at what heat level a heating element is set, may be displayed to the user using lighted text, digits, and/or symbols. Some users may desire that such lighted features appear white or another desired color. However, glass or ceramic-glass cooktop appliances often are made from transparent materials of a very dark red-brown or pink-orange color, particularly those with radiant heating sources. When white light is passed through such materials to illuminate text and/or symbols on the user interface, the light appears red-brown or pink-orange rather than white.

Accordingly, a cooktop appliance with features for correcting the color of light passing through the cooking panel such that the illuminated features appear a desired color to a user of the cooktop appliance would be beneficial.

BRIEF DESCRIPTION OF THE INVENTION

The present invention provides a cooktop appliance with features for correcting the color of light passing through the cooking panel such that the light appears a desired to a user of the cooktop appliance. More specifically, a colored translucent ink may be applied to a light transmissive layer of a user interface assembly such that light passing through the light transmissive layer and the cooking panel appears a desired color to the user. Additional aspects and advantages of the invention will be set forth in part in the following description, may be apparent from the description, or may be learned through practice of the invention.

In a first exemplary embodiment, a user interface assembly for a cooktop appliance is provided. The user interface assembly includes a cooking panel comprising a transparent material having a first color; a first printed circuit board spaced apart from the cooking panel, the first printed circuit board comprising a light source; a second printed circuit board disposed between the cooking panel and the first printed circuit board; and a light transmissive layer disposed between the cooking panel and the light source. The light transmissive layer includes a support substrate having a first surface facing the cooking panel and a second surface facing the light source, and a colored ink covering at least a portion of the support substrate, the colored ink having a second color configured such that light from the light source passing through the colored ink and the cooking panel appears a desired color to a user of the user interface assembly.

In a second exemplary embodiment, a user interface assembly for a cooktop appliance is provided. The user interface assembly includes a cooking panel comprising a transparent material having a first color; a printed circuit board spaced apart from the cooking panel, the printed circuit board comprising a light source; and a light transmissive layer disposed between the cooking panel and the printed circuit board. The light transmissive layer includes a support substrate having a first surface adjacent the cooking panel and a second surface adjacent the printed circuit board, and a colored ink covering at least a portion of the support substrate, the colored ink having a second color configured such that light from the light source passing through the colored ink and the cooking panel appears a desired color to a user of the user interface assembly.

These and other features, aspects, and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 1:
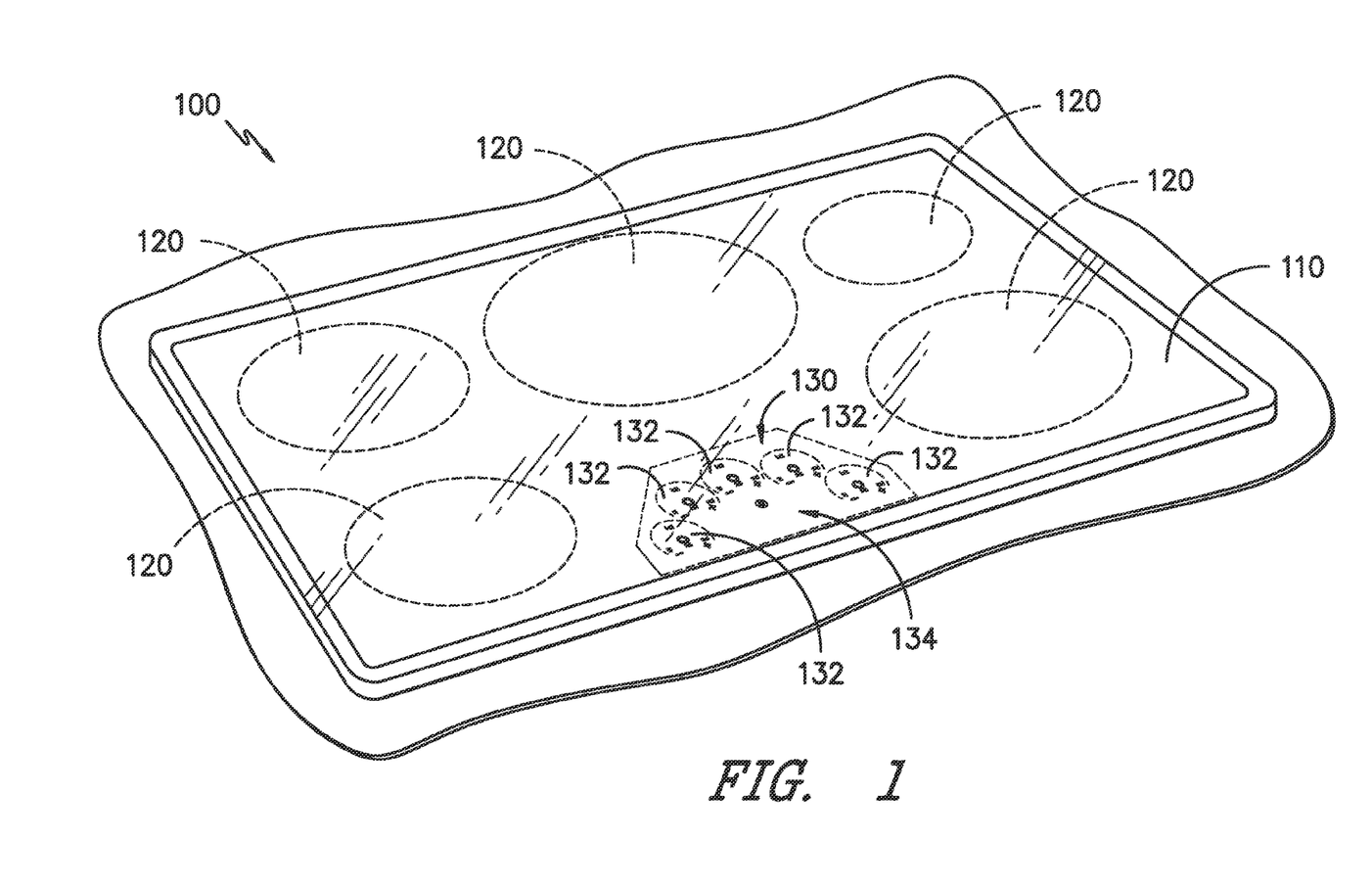
FIG. 1 provides a top perspective view of an exemplary embodiment of a cooktop appliance of the present subject matter.

FIG. 1 provides a top, perspective view of a cooktop appliance 100 according to an exemplary embodiment of the present subject matter. Cooktop appliance 100 can be installed in various locations such as in cabinetry in a kitchen, with one or more ovens to form a range appliance, or as a standalone appliance. Thus, as used herein, the term "cooktop appliance" includes grill appliances, stove appliances, range appliances, and other appliances that incorporate cooktops, which are generally known as surface cooking appliances.

Cooktop appliance 100 includes a cooking panel 110 for supporting thereon cooking utensils such as pots or pans. Cooking panel 110 is a transparent material that is, e.g., pink-orange or dark red-brown in color as defined by, e.g., the CIE Chromaticity Diagram. Further, cooking panel 110 may be constructed from, e.g., glass, ceramics, and/or combinations thereof. Radiant heating assemblies 120 are mounted below cooking panel 110 such that heating assemblies 120 are positioned below cooking panel 110, e.g., along a vertical direction V. While shown with five heating assemblies 120 in the exemplary embodiment of FIG. 1, cooktop appliance 100 may include any number of heating assemblies 120 in alternative exemplary embodiments. Heating assemblies 120 can also have various diameters. For example, each heating assembly 120 can have a different diameter, the same diameter, or any suitable combination thereof. Further, each heating assembly 120 may include one or more heating elements or zones.

Cooktop appliance 100 is provided by way of example only and is not limited to the exemplary embodiment shown in FIG. 1. For example, a cooktop appliance having one or more heating assemblies in combination with one or more electric or gas burner heating elements can be provided. In addition, various combinations of number of heating assemblies, position of heating assemblies and/or size of heating assemblies can be provided. Moreover, heating assemblies 120 can have a variety of constructions for the input of energy in the form of heat to the cooking utensils. For example, heating assemblies can be constructed as electric radiant, electric induction, or gas-on-glass heating sources. Mechanisms associated with each such type of heating source are positioned under cooking panel 110 and will be well understood of one of skill in the art using the teachings disclosed herein.

A user interface 130 provides visual information to a user and allows a user to select various options for the operation of cooktop appliance 100. For example, displayed options can include a desired heating assembly 120, a desired cooking temperature, and/or other options. User interface 130 can be any type of input device and can have any configuration. In FIG. 1, user interface 130 is located within a portion of cooking panel 110. Alternatively, user interface 130 can be positioned on a vertical surface near a front side of cooktop appliance 100 or anywhere convenient for a user to access during operation of cooktop appliance 100. Also, although described with respect to cooktop appliance 100, it should be readily understood that user interface 130 as described herein could be used with any suitable appliance.

In the exemplary embodiment shown in FIG. 1, user interface 130 includes one or more capacitive touch input components 132. Touch input components 132 can be used as part of a capacitive touch sensing system and can allow for the selective activation, adjustment or control of any or all heating assemblies 120 as well as any timer features or other user adjustable inputs. One or more of a variety of electrical, mechanical or electro-mechanical input devices including rotary dials, push buttons, toggle/rocker switches, and/or touch pads can also be used singularly or in combination with touch input components 132. User interface 130 also includes a display component 134, such as a digital or analog display device designed to provide operational feedback to a user. User interface 130 may further be provided with one or more graphical display devices that deliver certain information to the user such as, e.g., whether a particular heating assembly is activated and the level at which the heating element is set.

Operation of cooktop appliance 100 can be regulated by a controller (not shown) that is operatively coupled i.e., in communication with, user interface 130 and heating assemblies 120. For example, in response to user manipulation of a touch input component 132, the controller operates one of heating assemblies 120. The controller is also provided with other features. By way of example, the controller may include a memory and one or more processing devices such as microprocessors, CPUs or the like, such as general or special purpose microprocessors operable to execute programming instructions or micro-control code associated with operation of appliance 100. The memory may represent random access memory such as DRAM, or read only memory such as ROM or FLASH. In one embodiment, the processor executes programming instructions stored in memory. The memory may be a separate component from the processor or may be included onboard within the processor.

The controller may be positioned in a variety of locations throughout cooktop appliance 100. In the illustrated embodiment, the controller may be located under or next to the user interface 130. In such an embodiment, input/output ("I/O") signals are routed between the controller and various operational components of appliance 100 such heating assemblies 120, touch input components 132, sensors, graphical displays, and/or one or more alarms. In one embodiment, the user interface 130 may represent a general purpose I/O ("GPIO") device or functional block. User interface 130 may be in communication with the controller via one or more signal lines or shared communication busses.

Figure 2:
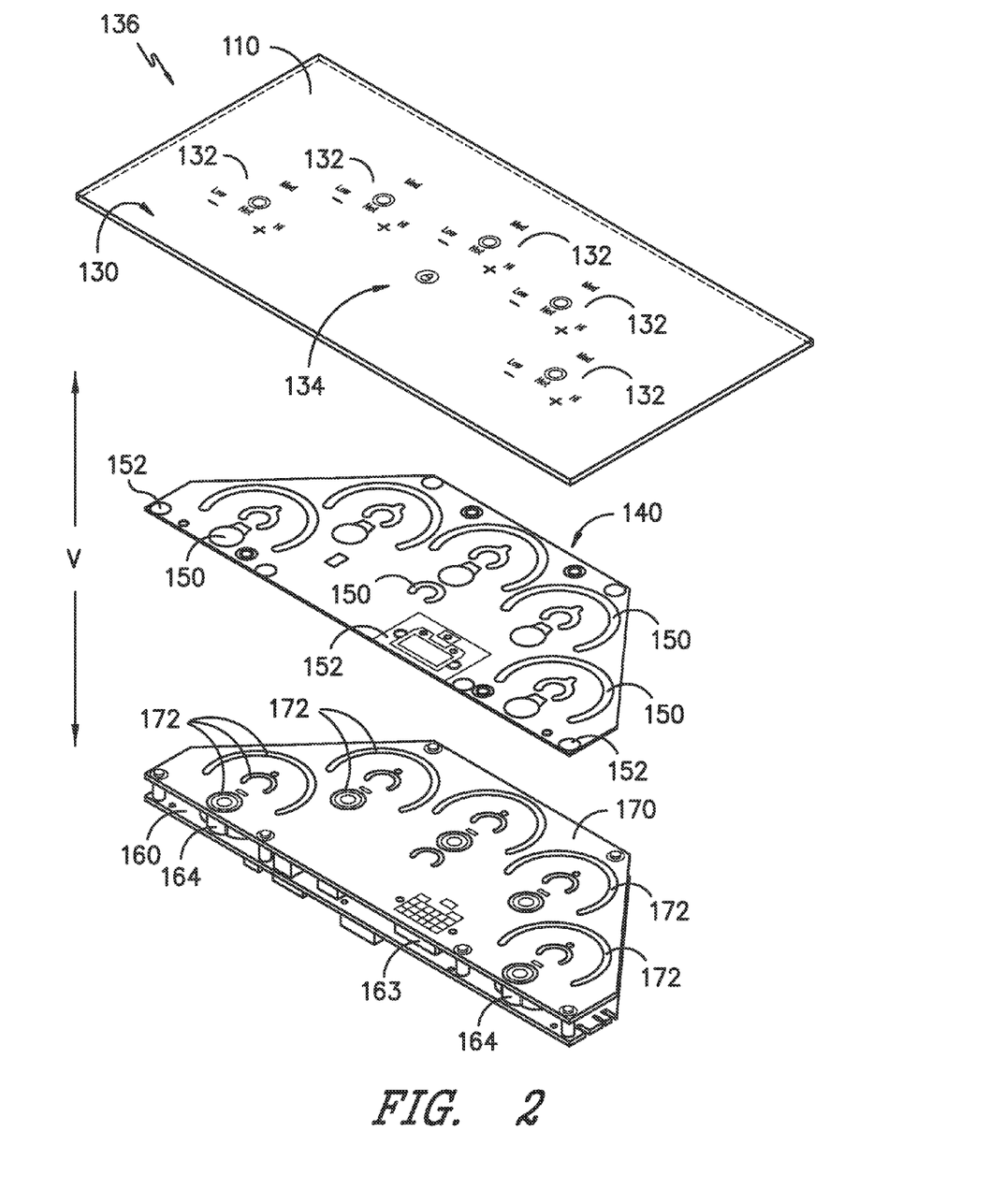
FIG. 2 provides an exploded view of an exemplary embodiment of a user interface assembly of the present subject matter.

FIG. 2 illustrates an exploded view of a user interface assembly 136 of cooktop 100. As shown, a user of cooktop appliance 100 may input and receive information regarding the operation of cooktop 100 at user interface 130, which is a portion of cooking panel 110. A variety of text, digits, and/or symbols may be printed on user interface 130 to indicate, e.g., the heat setting of a heating assembly 120 or the area of user interface 130 to touch to input certain information. In alternative embodiments, no text, digits, or symbols may appear on user interface 130 unless cooktop 100 is in use.

As shown in FIG. 2, a first printed circuit board 160 is positioned below user interface 130 along the vertical direction V. First printed circuit board 160 may include one or more light sources 162 (FIG. 7) for illuminating user interface 130. Each light source 162 may be, e.g., a polychromatic light emitting diode ("LED") such as a white LED, an incandescent lamp, or any other appropriate light source. First printed circuit board 160 may also include other features for controlling user interface 130 and/or cooktop appliance 100.

A second printed circuit board 170 may be positioned above first printed circuit board 160 but below user interface 130 along vertical direction V. Second printed circuit board 170 may include a capacitive touch sensing system, whereby cooktop 100 is controlled at least in part through touch inputs on user interface 130 by a user of cooktop 100, e.g., through capacitive touch input components 132. Second printed circuit board 170 may also include a plurality of apertures 172 for the passage of light from light sources 162 to user interface 130.

As further shown in FIG. 2, a light transmissive layer 140 is disposed between user interface 130 and light source or sources 162. In some embodiments, light transmissive layer 140 is positioned between user interface 130 and second printed circuit board 170. In alternative embodiments, light transmissive layer 140 may be disposed between first printed circuit board 160 and second printed circuit board 170.

In some embodiments, light transmissive layer 140 is a light diffusion layer, i.e., a diffuser, that diffuses the light from light sources 162 to provide uniform lighting of the illuminated text, digits, graphics, or other features on user interface 130 and may be, e.g., a frosted PET film. In other embodiments, light transmissive layer 140 is a graphics overlay, masking, or support layer that may be a clear layer of, e.g., a PET film for providing various graphics on user interface 130 by passing light through layer 140. Using a masking material 152 applied to light transmissive layer 140, text, digits, and/or symbols may be formed such that the text, digits, and/or symbols are presented to the user of cooktop 100 when illuminated by light source 162. Additionally, making material 152 may be used to mask various features of the construction of user interface assembly 136, e.g., circuit board pads, part labels, etc., such that the features are not visible to a user of cooktop 100. Masking material 152 may be, e.g., a black ink or the like.

Further, light transmissive layer 140 may include a colored or fluorescent translucent ink 150 printed thereon such that light from light sources 162 passing through ink 150 and cooking panel 110 substantially appears a desired color, such as white, to the user. For example, a shade of white to appear on user interface 130 may be specified by the shade's x, y coordinates on the CIE Chromaticity Diagram. The shade of light from light source 162 may also be specified by its x, y coordinates on the CIE Chromaticity Diagram, such that a light source 162 is selected to emit light of the specified color. Then, a colored or fluorescent dye, pigment, or colorant may be chosen for ink 150 such that when light from light source 162 passes through cooking panel 110 (having a first color as described above) and ink 150 (having a second color or being fluorescent), the light on user interface 130 appears in the shade of white having the desired x, y coordinates. Thus, "white" as used herein denotes any shade having x, y coordinates within the region of the CIE Chromaticity Diagram defining white light within the color spectrum visible to humans. However, other ways of defining and determining the color of the light appearing on user interface 130 may also be used. It will also be appreciated that, in the same way, a shade of polychromatic light source 162 and ink 150 may be chosen such that any shade of any desired color appears on user interface 130.

Several different combinations of different configurations of cooking panel 110, ink 150 and light source 162 may yield a desired color of light, such as essentially white light, on user interface 130. For example, light source 162 may be a white LED and ink 150 may be a blue-green colored translucent ink, with the white light from the LED and the blue-green color being defined by their x, y coordinates on the CIE Chromaticity Diagram. In such embodiments, white light from light source 162 passing through blue-green translucent ink 150 and pink-orange transparent cooking panel 110 appears as substantially white light on user interface 130. As a further example, light source 162 may be an ultraviolet LED and ink 150 may be a fluorescent translucent ink that fluoresces a blue-green color when exposed to ultraviolet light, i.e., ink 150 emits visible light that is a blue-green color when exposed to ultraviolet light. Thus, ultraviolet light from light source 162 passing through fluorescent translucent ink 150 and pink-orange transparent cooking panel 110 appears as essentially white light on user interface 130. As a third example, light source 162 may be an infrared LED and ink 150 may be a fluorescent translucent ink that fluoresces a blue-green colored visible light when exposed to infrared light such that light from light source 162 passing through fluorescent translucent ink 150 and pink-orange transparent cooking panel 110 appears as essentially white light on user interface 130. In still other embodiments, light source 162 may be a combination of ultraviolet and infrared LEDs and ink 150 may be a fluorescent translucent ink that fluoresces a blue-green colored visible light when exposed to ultraviolet and/or infrared light such that light from light source 162 passing through fluorescent translucent ink 150 and pink-orange transparent cooking panel 110 appears as substantially white light on user interface 130.

Colored or fluorescent translucent ink 150 may be, e.g., screen printed on portions of, or an entire surface of, light transmissive layer 140. In some embodiments, ink 150 may be a transparent dye or other appropriate colored or pigmented material. Other configurations of ink 150 may be used as well, and the configuration of ink 150 may be selected based on the color of cooking panel 110 and the desired color of light to appear on user interface 130. Moreover, the configuration of ink 150, including the placement of ink 150 and the material from which ink 150 is made, may be selected based on economic considerations, e.g., some configurations of ink 150 may lower the cost to produce cooktop 100.

Figure 3:
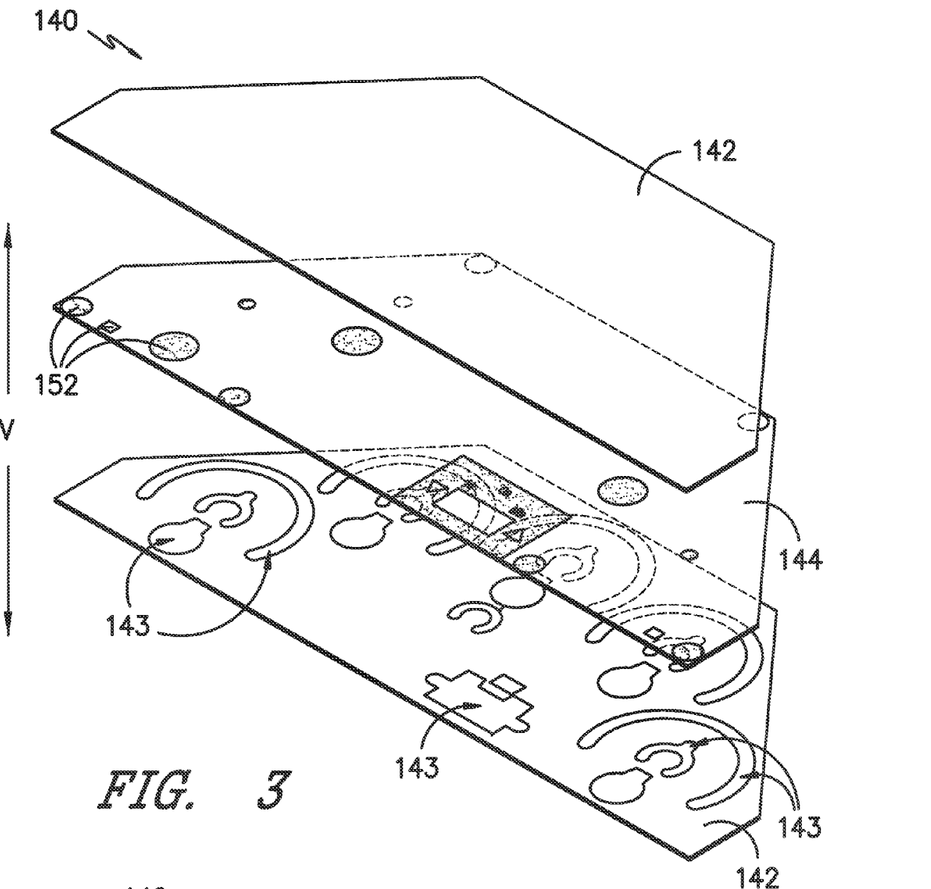
FIG. 3 provides an exploded view of an exemplary embodiment of a light transmissive layer of the present subject matter.
Figure 4:
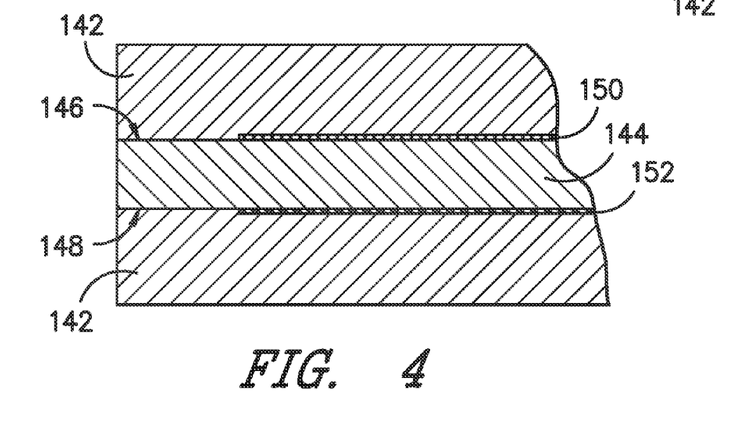
FIG. 4 provides a cross-section view of an exemplary embodiment of a light transmissive layer of the present subject matter.

FIGS. 3 and 4 illustrate light transmissive layer 140 in greater detail. FIG. 3 shows an exploded view of light transmissive layer 140, including layers of adhesive 142 above and below a support substrate 144 along the vertical direction V. More specifically, support substrate 144 has a first surface 146 and a second surface 148. First surface 146 faces cooking panel 110 and second surface 148 faces light source 162. In embodiments where light transmissive layer 140 is a light diffusion layer or diffuser, support substrate 144 may be a diffusive support substrate that diffuses light passing through the substrate. Support substrate 144 may have other configurations as well.

An adhesive 142, such as, e.g., a transfer tape, may be used to bond first surface 146 of support substrate 144 to cooking panel 110, and an adhesive 142 may be used to bond second surface 148 to second printed circuit board 170. As described, in alternative embodiments, light transmissive layer 140 may be disposed between first printed circuit board 160 and second printed circuit board 170; in such embodiments, second circuit board 170 may be bonded directly to the cooking panel 110, and light transmissive layer 140 may be secured in place by alignment pins (not shown) such that a layer of adhesive 142 is not needed. Each layer of adhesive 142 may be composed of the same adhesive material or may be composed of different adhesive materials, e.g., an appropriate adhesive may be selected for bonding support substrate 144 to cooking panel 110 and another appropriate adhesive may be selected for bonding support substrate 144 to second printed circuit board 170. Further, as illustrated in FIG. 3, adhesive 142 may be selectively applied such that there are one or more voids 143 in a layer of adhesive 142. Additionally, support substrate 144 may include one or more voids 143. Voids 143 may, e.g., aid in the assembly of light transmissive layer 140, allow light from light sources 162 to pass unimpeded through a layer of adhesive 142, or result from efficient application of adhesive 142.

As shown in FIG. 4, ink 150 may be applied to first surface 146 of support substrate 144, and masking material 152 may be applied to second surface 148 of support substrate 144. In alternative embodiments, ink 150 may be applied to second surface 148 and masking material 152 may be applied to first surface 146. In still other embodiments, ink 150 and masking material 152 may be applied to the same surface of support substrate 144, or masking material 152 may be omitted.

As an alternative to, or in addition to, applying ink 150 to one or more surfaces of support substrate 144, support substrate 144 may be made from a material containing a pigment, dye, or colorant such that support substrate 144 is a colored or fluorescent translucent or transparent material. That is, the colored or fluorescent pigment, dye, or colorant of ink 150 may be directly incorporated into support substrate 144 rather than being printed onto a surface of support substrate 144. Accordingly, as shown in FIG. 3, ink 150 may be omitted. In other embodiments, light transmissive layer 140 may include both a colored or fluorescent support substrate 144 and colored or fluorescent ink 150.

Figure 5:
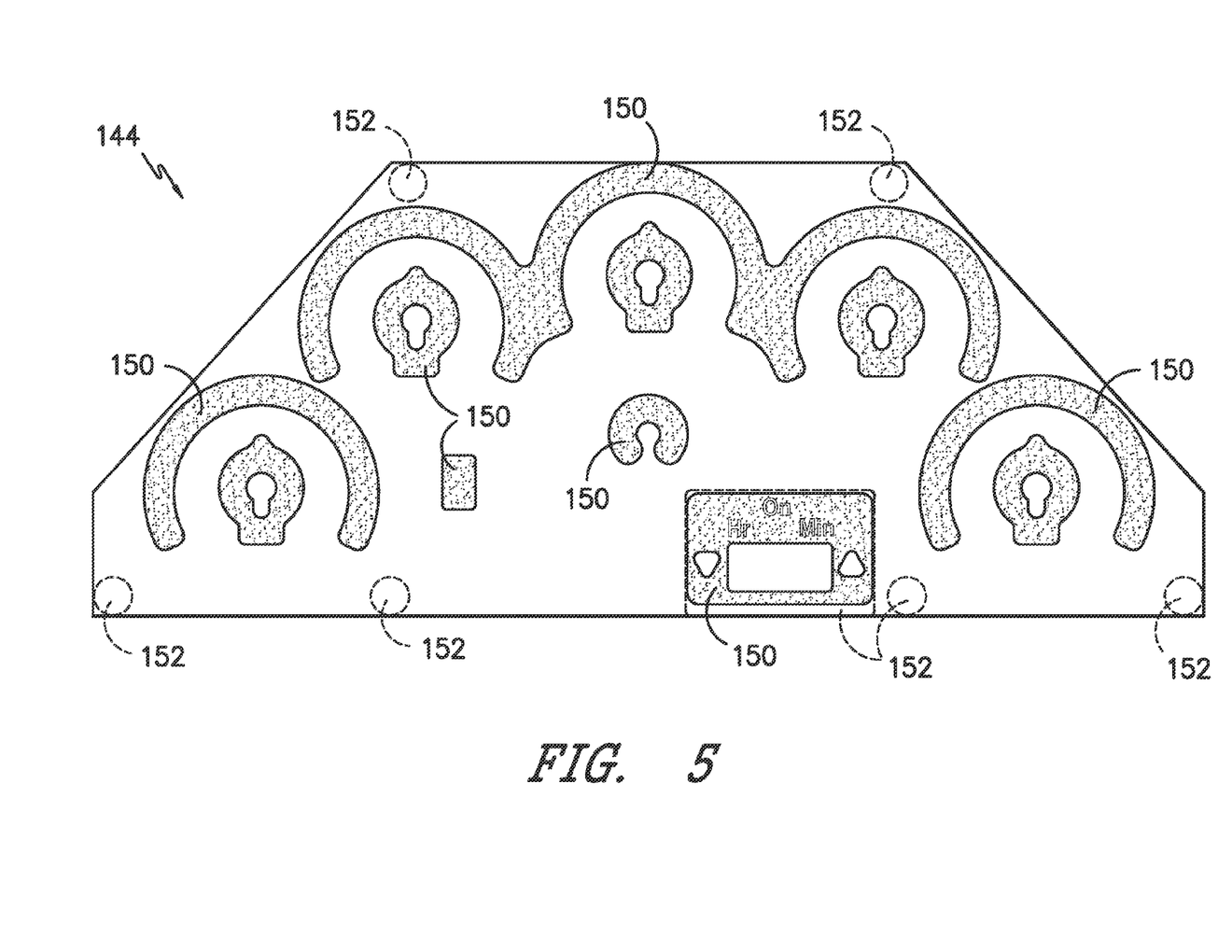
FIG. 5 provides a top view of the exemplary light transmissive layer of FIG. 4.

FIG. 5 illustrates a top view of support substrate 144 with ink 150 applied to first surface 146 and masking material 152 applied to second surface 148 of support substrate 144. As shown, ink 150 may be applied to selected portions of support substrate 144, namely, those portions of support substrate 144 through which passes light from light sources 162. Alternatively, ink 150 may be applied over the entire support substrate 144. In still other embodiments, as described, support substrate 144 may be made from a material that is colored or fluorescent such that light from light sources 162 passing through support substrate 144 appears as a desired color on user interface 130.

Figure 6:
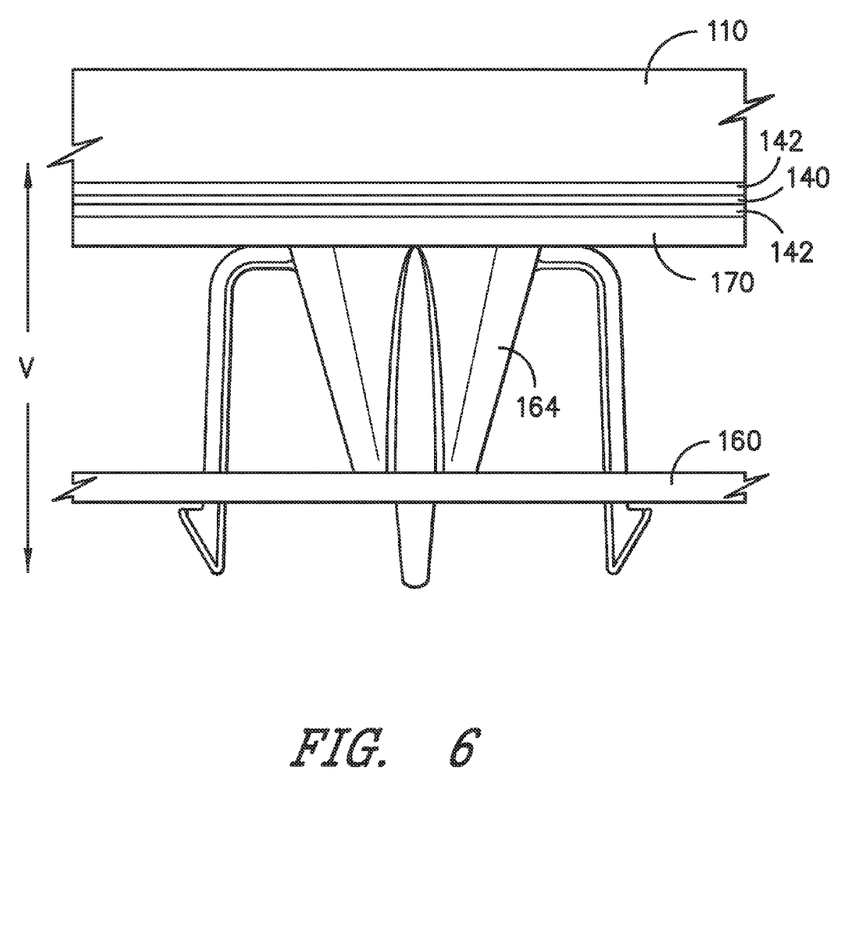
FIG. 6 provides a side view of an exemplary embodiment of a user interface assembly of the present subject matter.

As shown in FIG. 6, user interface assembly 136 may utilize one or more light guides 164 to guide light from light sources 162 toward user interface 130 located on cooking panel 110. In the embodiment shown in FIG. 6, light guide 164 is positioned between first printed circuit board 160 and second printed circuit board 170. As illustrated in the exemplary embodiments of FIGS. 6-8, light guides 164 may be of any suitable size and shape for guiding light toward user interface 130. Light guides 164 may be formed with air channels for guiding light toward user interface 130 or light guides 164 may comprise light pipes to convey light from light source 162 to user interface 130. Other configurations of light guides 164 may also be used.

Figure 7:
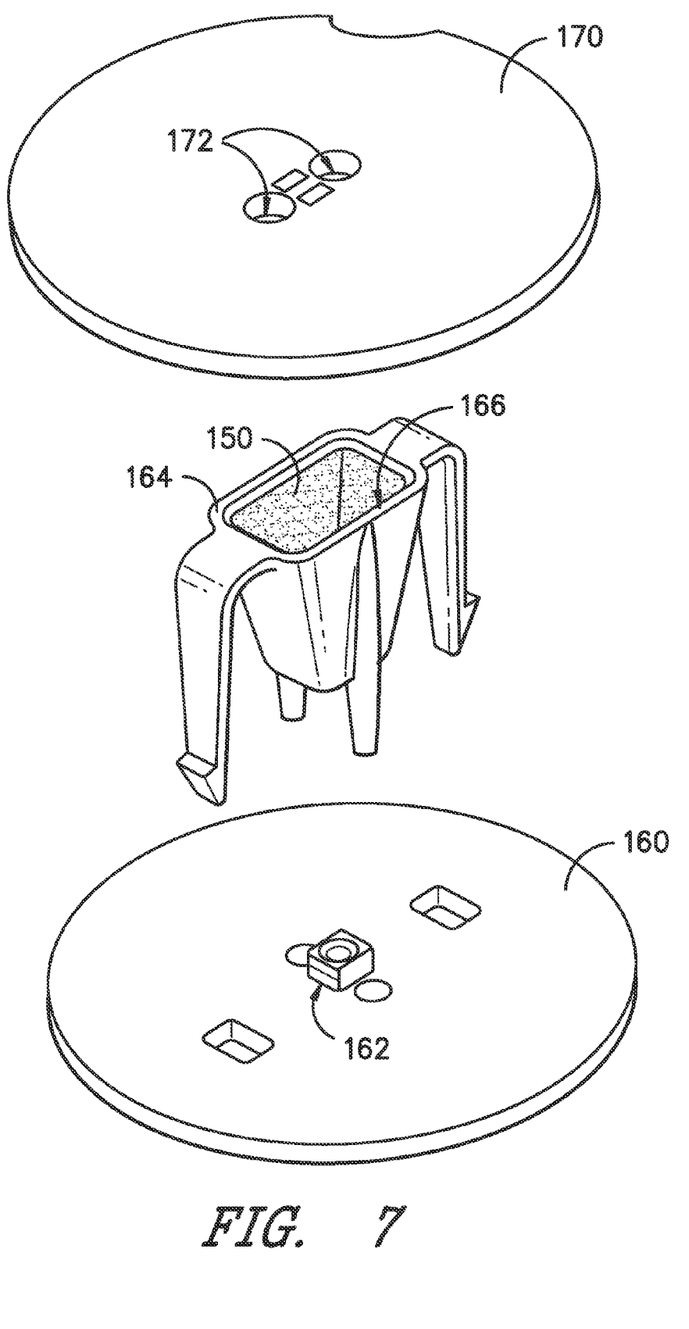
FIG. 7 provides an exploded view of an exemplary embodiment of a light guide and printed circuit boards of the present subject matter.
Figure 8:
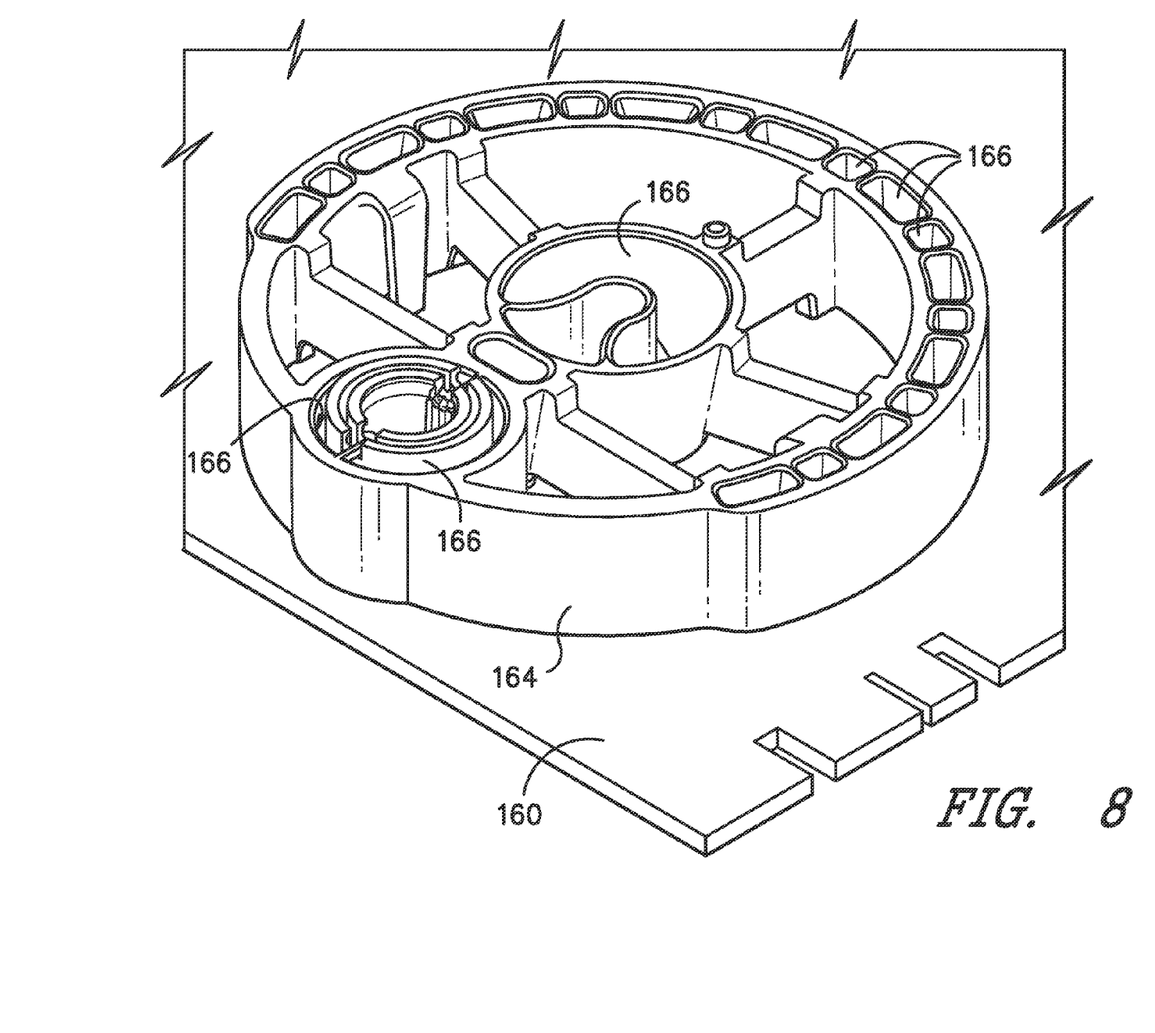
FIG. 8 provides a perspective view of an exemplary embodiment of a light guide of the present subject matter.

FIG. 7 illustrates an exploded view of a portion of first printed circuit board 160 and second printed circuit board 170, with a light guide 164 disposed therebetween. Light source 162 is positioned on first printed circuit board 160. Light guide 164 is positioned around light source 162 to guide light from light source 162 through apertures 172 of second printed circuit board 170 and toward user interface 130. As shown, ink 150 may be applied to an interior surface 166 of light guide 164. In such embodiments, light from light source 162 reflects off interior surface 166 as the light passes through light guides 164. Thus, after passing through cooking panel 110, light from light source 162 appears as white light on user interface 130.

As described above, ink 150 applied to interior surface 166 of light guides 164 may be an ink tinted with a color or fluorescent pigment, dye, or colorant such that when an appropriate light source 162 is used with light guide 164, the light from light source 162 appears a desired color on user interface 130. For example, light source 162 may be a white LED and ink 150 may be a blue-green colored ink as described above. In such embodiments, white light from light source 162 reflecting off blue-green ink 150 applied to interior surface 166 and passing through pink-orange transparent cooking panel 110 appears as essentially white light on user interface 130. As a further example, light source 162 may be an ultraviolet LED and ink 150 may be a fluorescent ink that fluoresces a blue-green colored visible light when exposed to ultraviolet light. Thus, ultraviolet light from light source 162 reflecting off fluorescent ink 150 applied to interior surface 166 and passing through pink-orange transparent cooking panel 110 appears as essentially white light on user interface 130. Moreover, light source 162 may be an infrared LED and ink 150 may be a fluorescent ink that fluoresces a blue-green colored visible light when exposed to infrared light such that light from light source 162 reflecting off fluorescent ink 150 and passing through pink-orange transparent cooking panel 110 appears as substantially white light on user interface 130. In still other embodiments, light source 162 may be a combination of ultraviolet and infrared LEDs and ink 150 may be a fluorescent ink that fluoresces a blue-green colored visible light when exposed to ultraviolet and/or infrared light such that light from light source 162 reflecting off fluorescent ink 150 and passing through pink-orange transparent cooking panel 110 appears as essentially white light on user interface 130. Other configurations of ink 150 applied to light guides 164 may be used as well, as described above.

Alternatively, light guide 164 may be made from a material containing pigment, dye, or colorant such that light guide 164 is made from a colored or fluorescent material. That is, the colored or fluorescent pigment, dye, or colorant of ink 150 may be directly incorporated into light guide 164 to tint light guide 164. Similar to the exemplary embodiment of FIG. 7, in such embodiments light from light source 162 reflects off interior surface 166 of tinted light guide 164 as it passes through light guides 164. Thus, an appropriate combination of a tinted light guide 164 and light source 162, such as, e.g., a white LED light source 162 and a blue-green tinted light guide 164 as described, will yield substantially white light on user interface 130.

Figure 9:
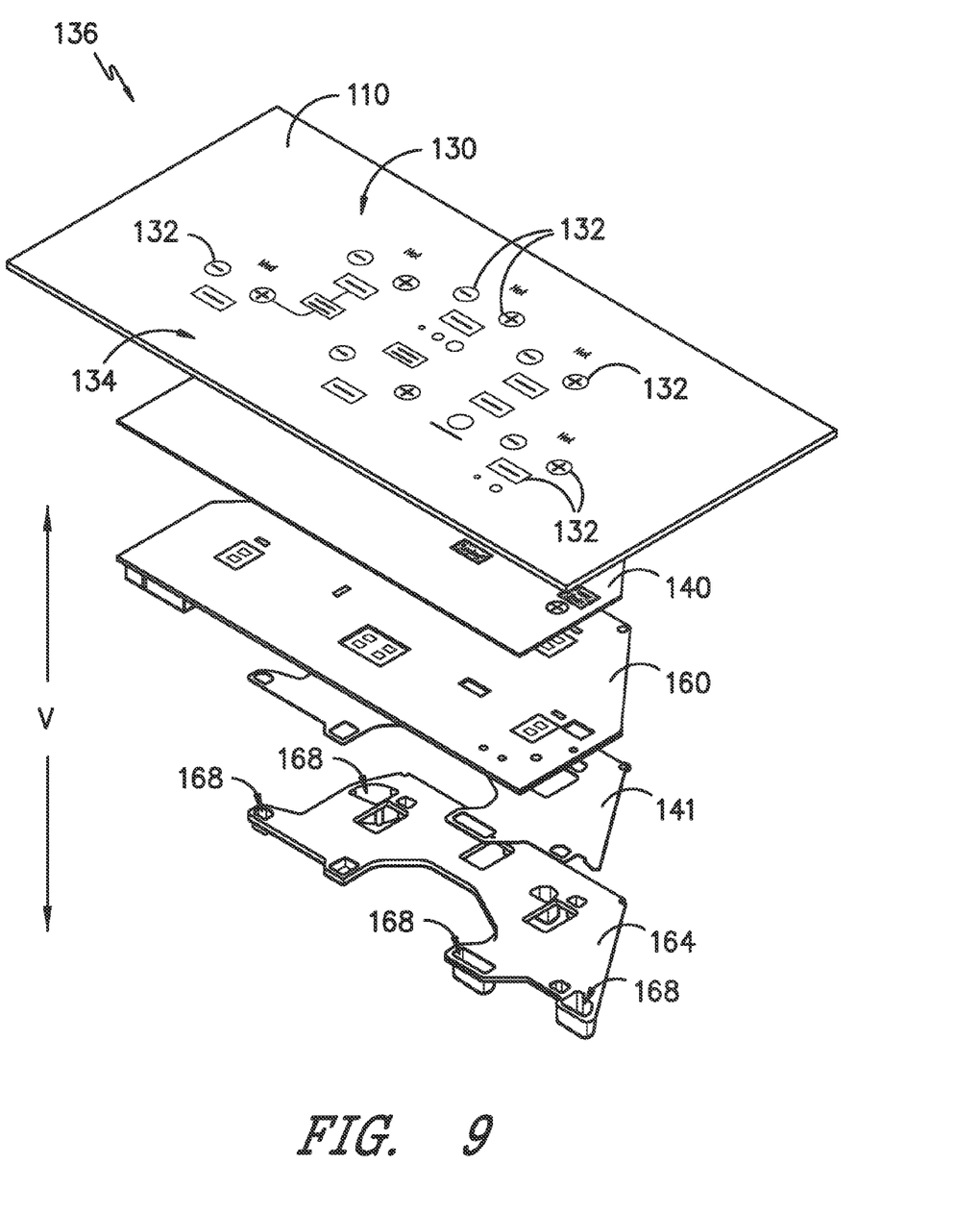
FIG. 9 provides an exploded view of an exemplary embodiment of a user interface assembly of the present subject matter.
Figure 10:
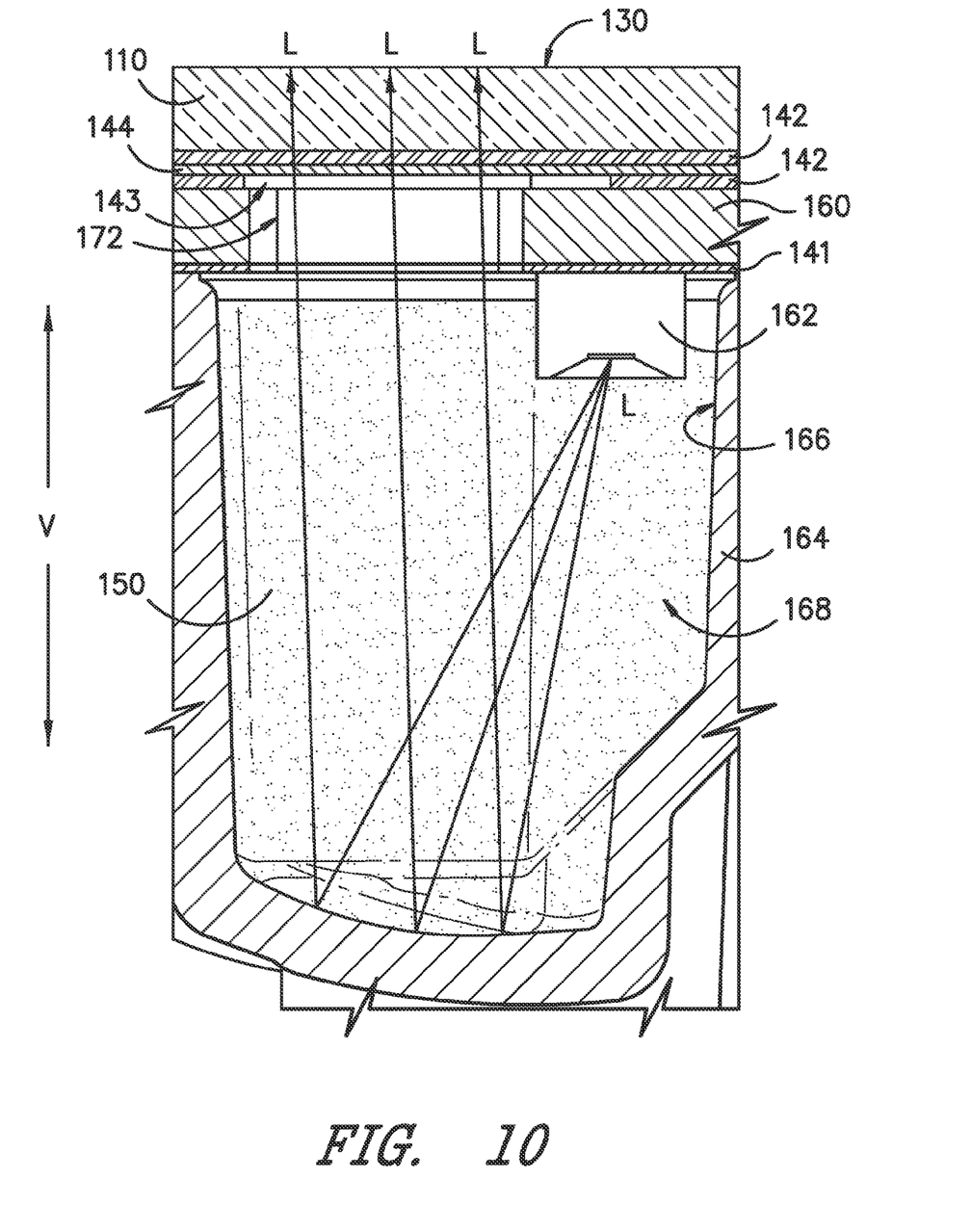
FIG. 10 provides a cross-section view of the exemplary user interface assembly of FIG. 9.
Figure 11:
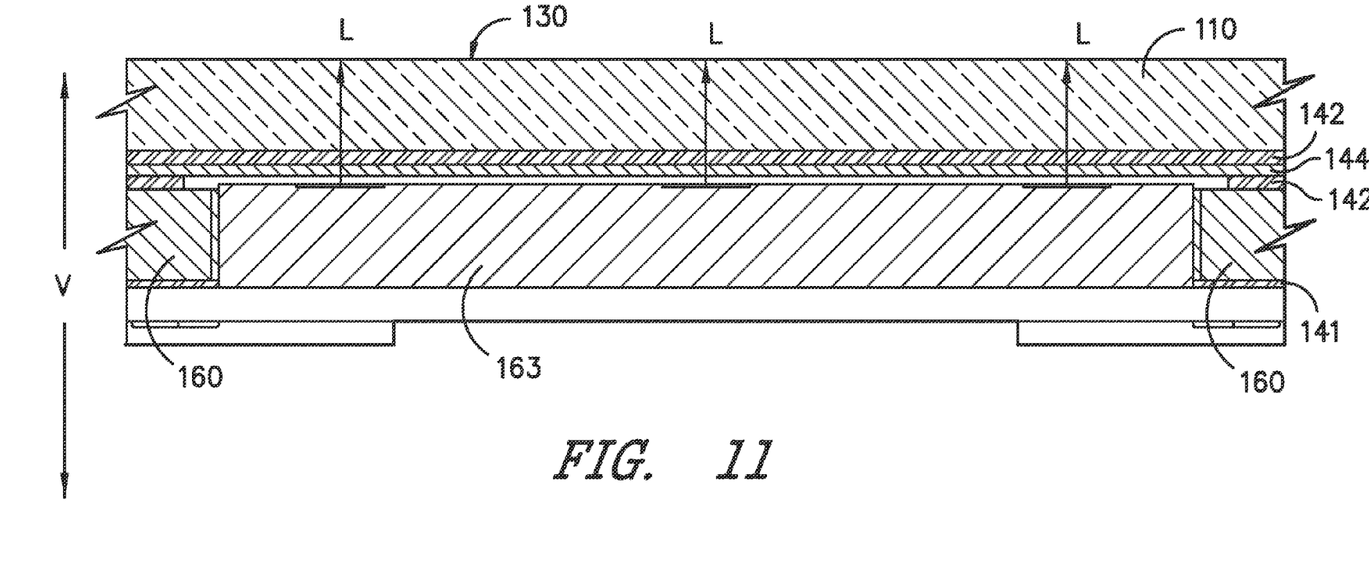
FIG. 11 provides another cross-section view of the exemplary user interface assembly of FIG. 9.

Referring now to FIGS. 9-11, an alternative exemplary embodiment of user interface assembly 136 is illustrated. As shown in the exploded view of FIG. 9, user interface assembly 136 may include user interface 130 and first printed circuit board 160 positioned below user interface 130 along the vertical direction V. Light transmissive layer 140 is disposed between user interface 130 and first printed circuit board 160 and may be held in place by layers of adhesive 142 (FIGS. 10-11). Light guide 164 is constructed as a single piece having a plurality of reflector boxes 168 and is held in place against the bottom surface of first printed circuit board 160 with a layer of adhesive 141. In alternative embodiments, light guide 164 may be constructed of one or more pieces, each piece having one or more reflector boxes 168. Further, as discussed, each layer of adhesive 141, 142 may be composed of the same adhesive material or may be composed of different adhesive materials, i.e., an appropriate adhesive may be selected for bonding one component to another component of user interface assembly 136, e.g., for bonding light guide 164 to first printed circuit board 160.

As shown in FIG. 10, light source 162 is positioned on first printed circuit board 160 such that the light L from light source 162 is directed away from cooking panel 110 and user interface 130. The plurality of reflector boxes 168 of light guide 164 guide light L from a plurality of light sources 162 toward user interface 130 by redirecting the light, i.e., light L from light source 162 is reflected off interior surface 166 of reflector box 168 and thereby directed toward user interface 130. As described with respect to the previous embodiment of user interface assembly 136, interior surface 166 of reflector boxes 168 may be coated with a colored or fluorescent ink or dye, or light guide 164 may be constructed from a material tinted with a color or a fluorescent pigment, dye, or colorant such that light L from light source 162 reflected from reflector boxes 168 and passing through cooking panel 110 appears as a desired color on user interface 130. For example, light source 162 may be an ultraviolet LED and interior surface 166 of reflector box 168 may be coated with a fluorescent ink 150 that fluoresces a blue-green colored visible light when exposed to ultraviolet light. Thus, ultraviolet light from light source 162 reflecting off fluorescent ink 150 applied to interior surface 166 and subsequently passing through pink-orange transparent cooking panel 110 appears as essentially white light on user interface 130.

FIG. 11 illustrates an alternative construction of light source 162. Light source 162 may be constructed as a seven-segment LED module 163 for displaying, e.g., numerical digits on user interface 130. As shown, light L from module 163 passes directly from module 163 through support substrate 144 and cooking panel 110 to user interface 130. Thus, ink 150 may be applied to support substrate 144 and/or support substrate 144 may be tinted as described such that light L from module 163 appears a desired color on user interface 130.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they include structural elements that do not differ from the literal language of the claims or if they include equivalent structural elements with insubstantial differences from the literal language of the claims.

What is claimed is:

1. A user interface assembly for a cooktop appliance, comprising:
    a cooking panel comprising a transparent material having a first color;
    a first printed circuit board spaced apart from the cooking panel, the first printed circuit board comprising a light source;
    a second printed circuit board disposed between the cooking panel and the first printed circuit board; and
    a light transmissive layer disposed between the cooking panel and the light source, the light transmissive layer comprising
        a support substrate having a first surface facing the cooking panel and a second surface facing the light source, and
        a colored ink covering at least a portion of the support substrate, the colored ink having a second color configured such that light from the light source passing through the colored ink and the cooking panel appears a desired color to a user of the user interface assembly.

2. The user interface assembly of claim 1, wherein the light source comprises a polychromatic LED.

3. The user interface assembly of claim 1, wherein the second printed circuit board comprises a capacitive touch sensing system for sensing touch inputs by the user.

4. The user interface assembly of claim 1, wherein the first color is pink-orange and the second color is blue-green.

5. The user interface assembly of claim 1, further comprising at least one light guide for guiding light from the light source to the cooking panel, the light guide disposed between the first and second printed circuit boards.

6. The user interface assembly of claim 1, wherein the colored ink is applied to the first surface of the support substrate.

7. The user interface of claim 1, wherein the light transmissive layer further comprises a masking material applied to the second surface of the support substrate.

8. The user interface assembly of claim 1, wherein the second printed circuit board comprises apertures for the passage of light from the light source through the second printed circuit board.

9. The user interface assembly of claim 1, wherein the desired color is essentially white.

10. A user interface assembly for a cooktop appliance, comprising:
    a cooking panel comprising a transparent material having a first color;
    a printed circuit board spaced apart from the cooking panel, the printed circuit board comprising a light source; and
    a light transmissive layer disposed between the cooking panel and the printed circuit board, the light transmissive layer comprising
        a support substrate having a first surface adjacent the cooking panel and a second surface adjacent the printed circuit board, and
        a colored ink covering at least a portion of the support substrate, the colored ink having a second color configured such that light from the light source passing through the colored ink and the cooking panel appears a desired color to a user of the user interface assembly.

11. The user interface assembly of claim 10, wherein the light source comprises a polychromatic LED.

12. The user interface assembly of claim 10, wherein the printed circuit board comprises a capacitive touch sensing system for sensing touch inputs by the user.

13. The user interface assembly of claim 10, wherein the first color is pink-orange and the second color is blue-green.

14. The user interface assembly of claim 10, further comprising at least one reflector box for reflecting light from the light source to the cooking panel, the reflector box disposed below the printed circuit board along the vertical direction.

15. The user interface assembly of claim 10, further comprising a plurality of reflector boxes for reflecting light from a plurality of light sources to the cooking panel, the plurality of reflector boxes molded as one piece and disposed below the printed circuit board along the vertical direction.

16. The user interface assembly of claim 10, wherein the colored ink is applied to the first surface of the support substrate.

17. The user interface assembly of claim 10, wherein the light transmissive layer further comprises a masking material applied to the second surface of the support substrate.

18. The user interface assembly of claim 10, wherein the transparent material of the cooking panel is a glass-ceramic material.

19. The user interface assembly of claim 10, wherein the desired color is essentially white.

* * * * *